(12) United States Patent
Charbonnier et al.

(10) Patent No.: US 6,323,936 B1
(45) Date of Patent: Nov. 27, 2001

(54) MACHINE FOR EXPOSING A PANEL TO LASER RADIATION

(75) Inventors: Serge Charbonnier, Chambray; Damien Boureau, Rouen, both of (FR)

(73) Assignee: Automa-Tech, Val de Reuil (FR)

( * ) Notice: Subject to any disclaimer, the term of this patent is extended or adjusted under 35 U.S.C. 154(b) by 0 days.

(21) Appl. No.: 09/688,953

(22) Filed: Oct. 16, 2000

(30) Foreign Application Priority Data

Nov. 5, 1999 (FR) .................................................. 99 13886

(51) Int. Cl.[7] ........................... G03B 27/32; G03B 27/42; G03B 27/54; A61N 5/00; G21K 5/10
(52) U.S. Cl. ................................. 355/53; 355/23; 355/24; 355/25; 355/26; 355/67; 355/71; 250/492.2; 250/492.22
(58) Field of Search .................................. 355/23, 24, 25, 355/26, 53, 71, 67; 250/492.2, 492.22

(56) References Cited

U.S. PATENT DOCUMENTS

| | | | |
|---|---|---|---|
| 5,654,817 | * | 8/1997 | De Loor ................................ 359/201 |
| 5,933,216 | * | 8/1999 | Dunn ....................................... 355/53 |
| 6,205,364 | * | 3/2001 | Lichtenstein et al. ................. 700/58 |

FOREIGN PATENT DOCUMENTS

| | | |
|---|---|---|
| 42 25 946 | 2/1994 | (DE) . |
| 0 729 265 | 8/1996 | (EP) . |

* cited by examiner

*Primary Examiner*—Russell Adams
*Assistant Examiner*—Khaled Brown
(74) *Attorney, Agent, or Firm*—O'Melveny & Myers LLP

(57) ABSTRACT

The invention relates to a machine for exposing a panel to laser radiation, said panel having a working length L in a first direction Y, and being subdivided into N successive segments. The machine has a fixed structure; a horizontal panel support that is movable relative to the structure; device for generating and modulating N laser beams; and N optical units which are fixed relative to the structure. Each optical unit has deflector device for generating a continuously deflected beam, and a mirror for directing the deflected beam towards the panel, the length $l_1$ of the mirror being greater than L/N. The optical units are organized as two sets, with the units in any one set being juxtaposed so that their mirrors are substantially in alignment along the Y direction, the distance in the Y direction between the optical axes of two juxtaposed optical units in the same set being equal to 2L/N and the distance in the Y direction between the optical axis of a unit in one set and the optical axis of an optical unit in the other set that is closest thereto being equal to L/N, thereby enabling the deflected laser beam from one optical unit to scan a length $l_1$ that is longer than the length of the segment that needs to be scanned.

6 Claims, 5 Drawing Sheets

MACHINE FOR EXPOSING A PANEL TO LASER RADIATION

The present invention relates to a machine for exposing a panel, in particular a printed circuit panel, to laser radiation.

BACKGROUND OF THE INVENTION

There exist various known techniques that make use of laser beams for making printed circuits, and more precisely for implementing one of the steps of the method consisting in defining conductor tracks of the printed circuit using a layer of metallization formed on an insulating backing. Such techniques can consist either in transforming the state of a layer of resist with the help of the laser beam, or else in directly ablating the layer of resist so as to reveal the layer of metallization, or finally in not using a layer of resist at all and in proceeding directly with ablation of the layer of metallization with the help of the laser beam. The present invention relates to all three of those methods which make use of a laser beam.

Naturally, in such a technique, each point or pixel on the surface of the working zone of the printed circuit panel is scanned by the laser beam which is either in an active state or in an interrupted state depending on whether the corresponding point is to be printed or not. Scanning control is associated with computer means which contain information in memory serving, for each pixel associated with its coordinates, to specify the printed or unprinted state to be achieved.

In known techniques, scanning is performed by means of a single laser beam which must therefore scan the entire surface of the panel. More precisely, the laser beam makes successive scans in one of the directions of the panel and the scans are offset in the other direction.

It will be understood that when printed circuits are of large size, the operation of scanning by means of a single laser beam in application of known techniques can require a considerable length of time. It would therefore be advantageous to provide an exposure machine in which scanning is performed simultaneously by a plurality of laser beams, each laser beam scanning a respective zone of the printed circuit.

However, it will readily be understood that using a plurality of scanning laser beams simultaneously cannot be achieved merely by juxtaposing devices each of which uses a single scanning laser beam. It will be understood that to obtain continuity in the printed circuit from one scan zone to another scan zone, specific problems are encountered.

It should also be emphasized that in order to define the shape of the conductor tracks very accurately, laser beams are used having an impact diameter on the panels of 20 $\mu$m. However, because of the way energy is unevenly distributed within such a circle and also because of the way impacts overlap due to scanning, the net result is as though the surface of the panel that is printed by an impact is a square of 12.7 $\mu$m×12.7 $\mu$m. The length of 12.7 $\mu$m thus constitutes the unit of definition applied to the various patterns that are made on the panel in the two orthogonal directions thereof. To conserve the precision of such definition, it is necessary for the laser beam striking the printed circuit panel to be perpendicular thereto. In addition, it is necessary in each zone to have a certain amount of latitude available for adjustment in the scan direction of the laser beam in order to be able to accommodate positioning imperfections in the various components used in generating and controlling the laser beam.

OBJECTS AND SUMMARY OF THE INVENTION

An object of the present invention is to provide a machine for exposing panels to laser radiation that makes use of a plurality of laser beams operating simultaneously, while nevertheless obtaining a printed circuit having the same quality of definition as when only one laser beam is used.

To achieve this object, the invention provides a machine for exposing a panel to laser radiation, said panel having a working length L in a first direction Y, said length L being divided into N successive segments of length L/N, said machine comprising:

a fixed structure;

a horizontal panel support for receiving said panel;

displacement means for moving said support relative to the structure in a direction X that is orthogonal to the Y direction of the panel;

means for generating N main laser beams;

modulator means for modulating each main laser beam in time; and

N optical units that are fixed relative to said structure each having an optical axis in a direction that is substantially orthogonal to the Y direction, each optical unit comprising:

deflector means for periodically converting one of the main beams into a beam that is continuously deflected and that is modulated in time, said beam being directed along the optical axis of said optical unit; and a deflector mirror for directing said deflected laser beam in a direction orthogonal to the X,Y plane towards said panel support, the length $l_1$ of said deflector mirror in the direction orthogonal to the optical axis of said unit and suitable for being struck by said beam during each period being greater than L/N;

said optical units being organized as two sets of optical units with each set having N/2 units if N is even and ½(N+1) and ½(N−1) units if N is odd, the units within each set being juxtaposed in the Y direction in such a manner that their deflector mirrors are substantially in alignment along the Y direction, the distance in the X direction between the deflector mirrors of the two sets being equal to D, the distance in the Y direction between the optical axes of two juxtaposed optical units in the same set being equal to 2L/N and the distance in the Y direction between the optical axis of a unit in one set and the optical axis of the nearest optical unit in the other set being equal to L/N, whereby the deflected laser beam from an optical unit is capable of scanning over a length $l_1$ that is longer than the length of the panel segment that needs to be scanned, the deflected laser beam thus being capable of being controlled to scan the panel segment from its first end to its second end.

Specifically because of the particular disposition of the optical units which are disposed in two parallel lines, the optical units of one assembly being offset by one "half-pitch" relative to those of the other set, using the term "pitch" to designate the distance between the optical axes of two juxtaposed units in the same set, it is possible to cause the scan zones of the various optical units to overlap. This possibility of causing the scan zones to overlap makes it possible, given the inevitable positioning inaccuracies of the various components constituting the optical unit, to make the corrections necessary to achieve the precision that is desired concerning the successive points of impact of the laser beams that actually scan each zone of the panel.

Preferably, the means for deflecting each optical unit comprise:

a rotary polygonal mirror having n facets for continuously deflecting said laser beam in the same plane during successive fixed periods corresponding to said facets; and objective lens means to focus and direct the beam as deflected successively by each facet of the polygonal mirror along the direction of said optical axis and in a common plane containing the Y direction.

In a preferred embodiment, the modulator means comprise an acousto-optical modulator which receives the main beam and which outputs said beams that are successive in time, during said fixed periods.

It will be understood that controlling the transparent or non-transparent state of the acousto-optical modulator makes it possible, in addition to modulating the laser beam, to synchronize the state of the modulator with the rotation of the polygonal mirror and thus with the position of each of its reflecting faces. This makes it possible in particular to introduce corrections, as explained below, so as to ensure that the ends of each scan segment are positioned precisely.

In a preferred embodiment of the machine:

the displacement means for moving the panel support in the X direction move said support continuously at a constant speed; and said direction of the optical axis of each optical unit is at an angle a with a direction orthogonal to the Y direction so as to compensate for the effect of the continuous displacement of the support in the X direction.

When the panel support is moved at constant speed, which corresponds at present to the optimum solution, introducing the angle a makes it possible to ensure that the segments that are scanned simultaneously by the various laser beams are continuous with one another.

BRIEF DESCRIPTION OF THE DRAWINGS

Other characteristics and advantages of the invention will appear better on reading the following description of various embodiments of the invention given as non-limiting examples. The description refers to the accompanying figures, in which.

MORE DETAILED DESCRIPTION

Figure 1:
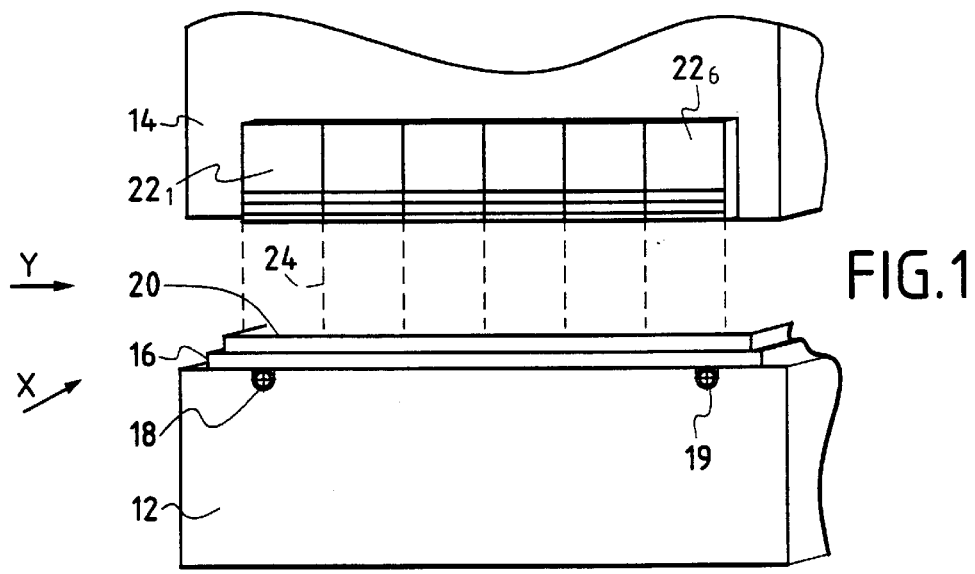
FIG. 1 is a diagrammatic elevation view of the exposure machine as a whole.

The exposure machine as a whole is described initially with reference to FIG. 1. It comprises a structure having a bottom portion 12 and a top portion 14, the structure being fixed. The bottom portion 12 of the structure supports a moving slab 16 for receiving a panel 20. The slab 16 can move in an X direction, i.e. in a direction that is orthogonal to the plane of the figure. For this purpose, motor-driven ball-screw systems 18 and 19 are shown diagrammatically. The support slab 16 is designed to receive printed circuit panel 20 which is to be subjected to the laser beam to define the conductor tracks that are to be made on the printed circuit panel. The top portion 14 of the structure supports optical units that are represented diagrammatically by rectangles $22_1$ to $22_6$. Each optical unit 22 delivers a laser beam at its outlet, the laser beam having a direction that is orthogonal to the plane of the panel 20, i.e. a vertical direction. The scan zones of each laser beam are represented symbolically by dashed lines 24, scanning being performed in a Y direction that is orthogonal to the X direction.

Figure 3:
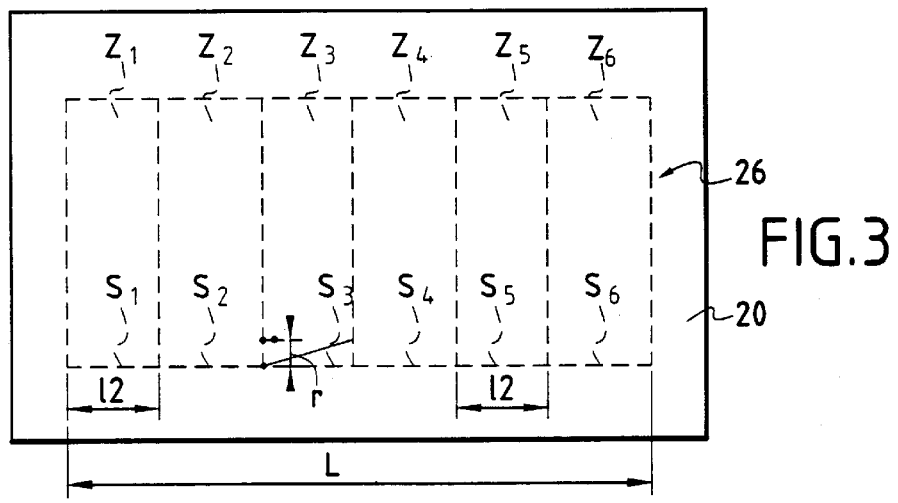
FIG. 3 is a diagrammatic view showing how a panel is scanned by the laser beams.

In the machine described by way of example, and with reference to FIG. 3, the working area 26 of the panel 20 is scanned simultaneously by six laser beams each scanning in the Y direction over a respective zone $Z_1$, $Z_2$, $Z_3$, $Z_4$, $Z_5$, or $Z_6$ of the working area of the panel. The term "scanning" is used to mean that the laser beam is moved continuously in the Y direction. The displacement unit is the pixel, i.e. the smallest pattern element that can be made using the laser beam. In this particular example, each pixel is a square of side equal to 12.7 μm, as already stated. In reality, while a segment S is being scanned, there are subsegments corresponding to an actual impact of the laser beam and subsegments corresponding to the laser beam being interrupted. The "unit" of width of these subsegments is naturally the pixel. Scanning in the X direction orthogonal to the Y direction is performed as already explained by moving the panel in the X direction. Using the notation whereby the total length of the working area 26 of the panel in the Y direction is written L, each laser beam needs to scan a segment $S_1$, $S_2$, etc. of length $l_2$, where $l_2$ is equal to L/N. The number N of beams could naturally be other than six.

It can be seen that in order to ensure continuity of the pattern to be made from one zone to an adjacent zone, it is necessary for the last impact of one scan segment, e.g. of the segment $S_1$, should be at a distance of one pixel from the first point of impact of the next scan segment, in this case segment $S_2$.

Figure 2:
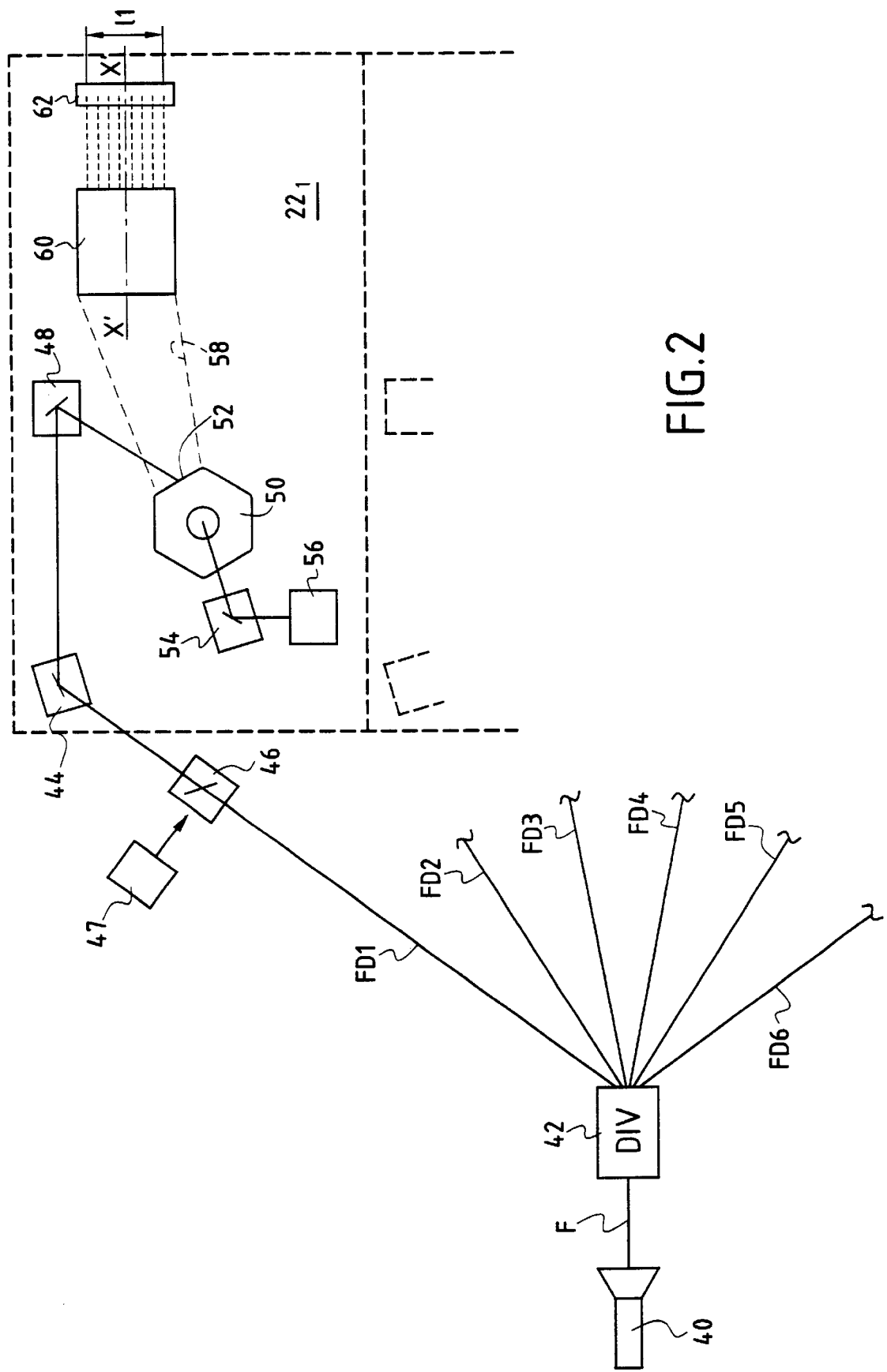
FIG. 2 is a simplified view of the optical portion of the exposure machine.

With reference now to FIG. 2, there follows a description of the essential elements of the optical portion of the exposure machine enabling the panel to be scanned simultaneously by a plurality of laser beams, six in this case.

The optical assembly comprises a laser 40 which is preferably of the argon type delivering power at 7 W when the machine operates by modifying the state of the resist layer. The beam F delivered by the laser 40 is applied to the input of a beam splitter 42 which splits the beam into six divisional beams FD1, FD2, FD3, FD4, FD5, and FD6. Preferably, all of the divisional beams FD have powers of the same order of magnitude and comprise a limited number of wavelengths which are very close together.

Each divisional beam FD is applied to the input of an acousto-optical modulator 46 associated with a control circuit 47. As is well known, the modulator can take a transparent state or a non-transparent state where it interrupts transmission of the laser beam. Each laser beam leaving a modulator is applied to the inlet of an optical unit 22. The optical unit comprises an inlet optical system 44 and an optical system 48 designed to direct the beam to a rotary polygonal mirror 50. As is well known, the polygonal mirror 50 is constituted by a plurality of reflecting faces 52. In the particular case shown in FIG. 2, there are six reflecting faces. In other embodiments, the mirror could have ten faces. The mirror 50 is rotated by a motor 54 associated with a control circuit 56 and with position sensors.

As is well known, the laser beam leaving the optical system 48 strikes a facet 52 of the polygonal mirror at an angle of incidence that varies continuously as a function of rotation of the mirror. The laser beam reflected by the face is thus deflected continuously. The angle over which the reflected beam is deflected by the rotation of the facet of the polygonal mirror is represented symbolically by reference 58. Beam deflection by a rotary mirror facet corresponds to scanning a segment S of the panel. The beginning and the end of scanning by the laser beam are defined by synchronizing the transparent or non-transparent state control of the modulator with rotation of the polygonal mirror. The modulator is naturally not transparent during the lapse of time during which the incident laser beam would otherwise have passed from one facet of the mirror to the next. Each facet thus defines a scan period that corresponds to one segment. The beam is applied to the inlet of an objective lens system 60. The lens 60 serves both to focus the laser beam so that its diameter in this case is equal to 20 μm, i.e. greater than pixel size, and also to direct the laser beam in the direction X'X' of the optical axis of the optical unit.

Finally, the optical unit 22 comprises as essential elements a deflector mirror 62 which is orthogonal to the optical axis X'X' of the optical unit. The mirror 62 reflects the deflected laser beam in a vertical direction, i.e. towards the panel support 16 and thus towards the panel itself, and it does so orthogonally thereto. The beam is deflected in such a manner that the deflected beam strikes the mirror 62 at points which extend over a length $l_1$ centered on the optical axis X'X'. The optical components are made in such a way that the length $l_1$ is greater than the length $l_2$ corresponding to the scan zone Z on the panel that is associated with the laser beam in question.

Figure 4:
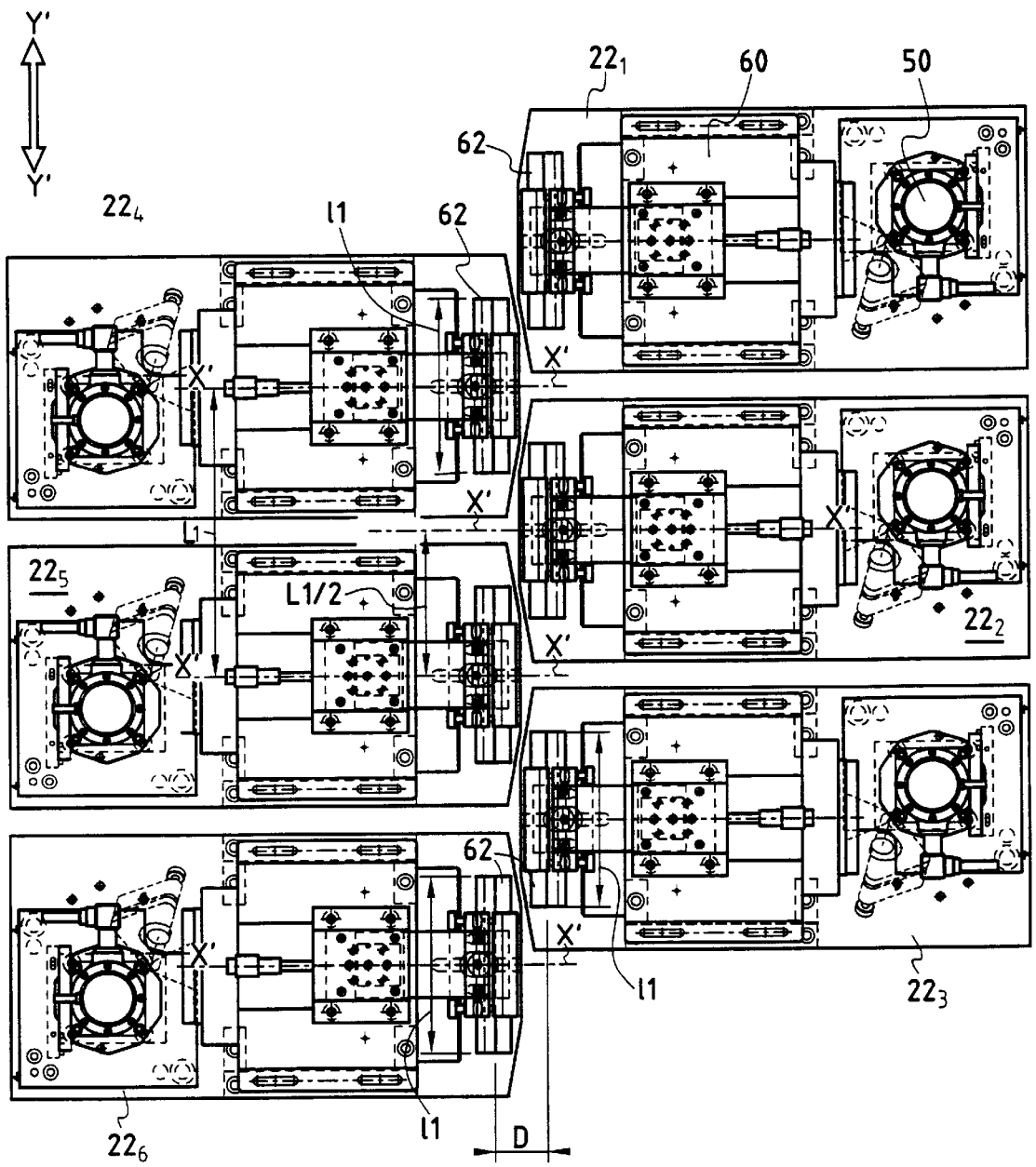
FIG. 4 is a plan view of the set of optical units in the exposure machine.

With reference now to FIG. 4, the relative disposition of the optical unit 22 fixed on the top portion 14 of the structure of the machine is described. In the particular example under consideration, there are six laser beams and thus six optical units 22. These optical units are organized as two sets of three units each which are juxtaposed in the direction Y'Y' which is orthogonal to the direction X'X' of the optical axes of the unit. The optical units in a one set are spaced apart from one another by a distance equal to $L_1$ where $L_1$ is equal to 2L/N. The optical units in the two sets are referenced respectively $22_1$ to $22_3$ and $22_4$ to $22_6$, and they are interleaved, i.e. the distance between the optical axis of a unit in a first set to the optical axis of a unit in the first set to the optical axis of the nearest unit in the second set is equal to $L_1/2$, i.e. L/N. In this figure, the length $l_1$ can be seen which corresponds to the available scan range for the beam that is deflected by a single face of a rotary mirror. It will be understood that on passing from an optical unit in one set of optical units to the next unit in the other set, the lengths $l_1$ which can be scanned by the corresponding laser beams overlap. Similarly, given the shape of the optical units, there is a distance D between the points of impact of the beams on the outlet mirrors 62 of the optical units, where the mirror belong to units in different sets.

Figure 7:
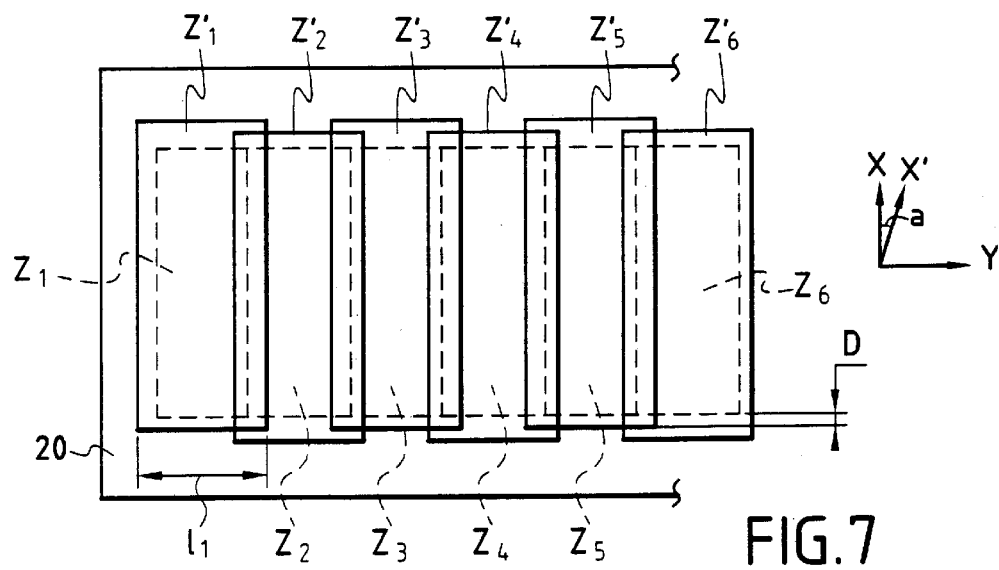
FIG. 7 shows how the zones scanned by the various laser beams can be adjusted.

With reference now to FIG. 7, the adjustments available for the six laser beams due to the dispositions of the invention are described. In this figure, the zones $Z_1$ to $Z_6$ which are to be scanned by the respective laser beams are drawn using dashed lines, and these zones are rigorously juxtaposed in the Y direction of the panel. Solid lines mark the zones $Z'_1$ to $Z'_6$ which can be scanned by the respective laser beams. It will be understood that these zones are of the width $l_1$ which is greater than $l_2$ and it will also be understood that between the zones $Z'_1$ that can be scanned by the optical unit $22_1$ of the first set of optical units and the zone $Z'_2$ that can be scanned by the optical unit $22_4$, there exists an offset D in the X direction of the panel.

Thus, by suitably controlling the acousto-optical modulator 46 of each optical unit, it is possible to define for each facet 52 of its polygonal mirror the instant at which a zone $Z_i$ begins to be scanned in such a manner as to make the scanning correspond accurately with said zone in spite of imperfections in the positioning of the various optical systems. It will also be understood that to obtain scanning of the zones Z in the X direction, the acousto-optical modulators 46 of the optical unit in the first set are operated later than the optical modulators of the optical units in the second set so as to take account of the offset D in the X direction.

It will thus be understood that the invention makes it possible to obtain continuous scanning of the entire working area of the panel even though the scanning is performed simultaneously by six distinct laser beams. The panel is moved in the X direction by the screw systems 18 and 19 in continuous manner. As a result, for each scan of a zone by a laser beam, scanning does not take place exactly in the Y direction but in a direction Y' at an angle a to said direction because the displacements in two directions are summed. The tangent of the angle a corresponds to the ratio between the distance referenced r from one scan to the next scan in the X direction divided by the length $l_2$ of the scan in a zone. The distance r corresponds to the size of the laser beam impact on the panel which is about 12.7 μm. The tangent of the angle a thus corresponds to $r/l_2$. This angle is thus small. To compensate for this phenomenon, the optical axes X'X' of each optical unit does not extend exactly along the X direction of the structure but at the angle a relative to said direction. Naturally, the angle a is in opposite directions for the optical units in the first set and for the optical units in the second set.

Figure 5:
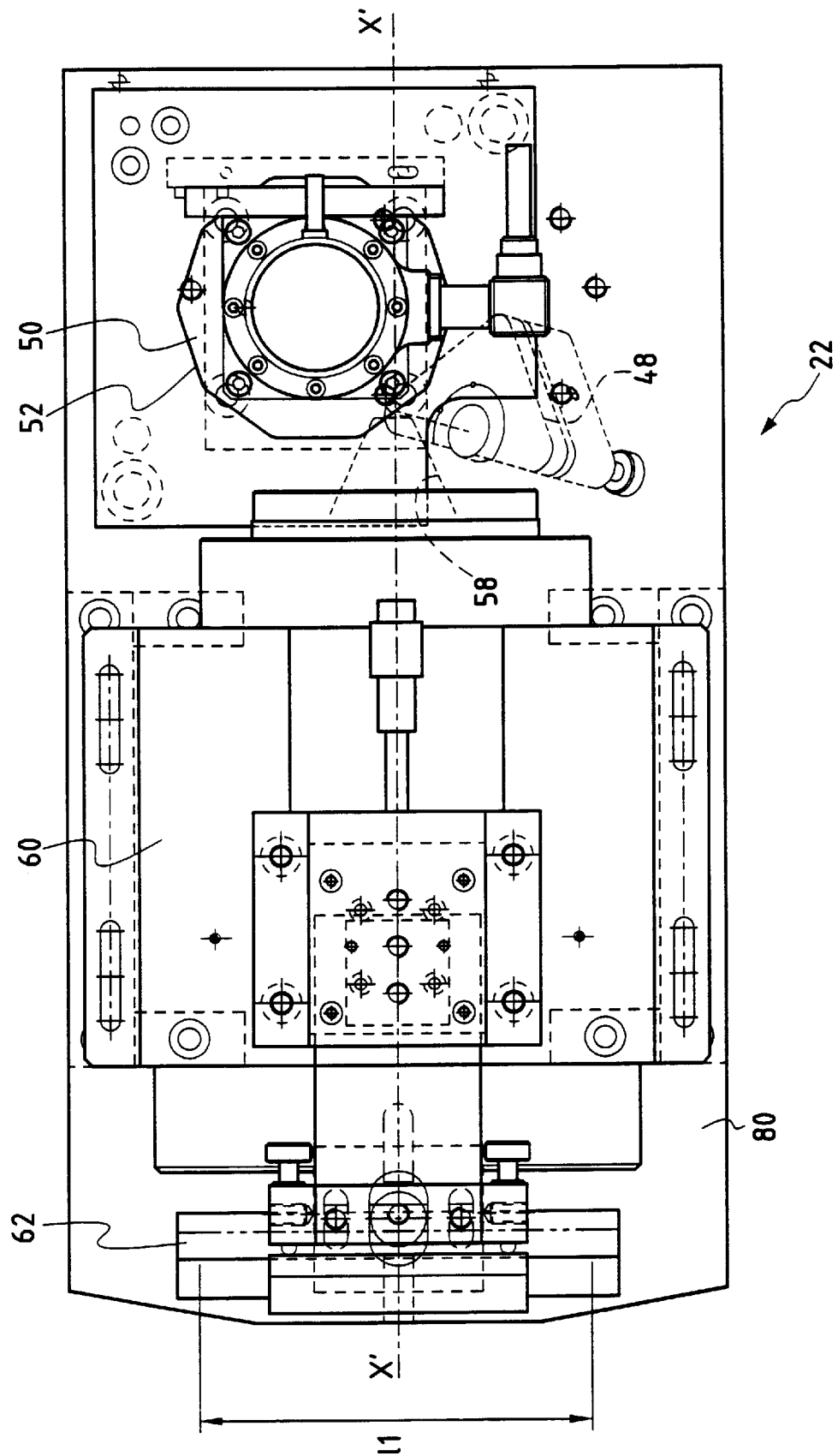
FIG. 5 is a plan view of an optical unit.
Figure 6:
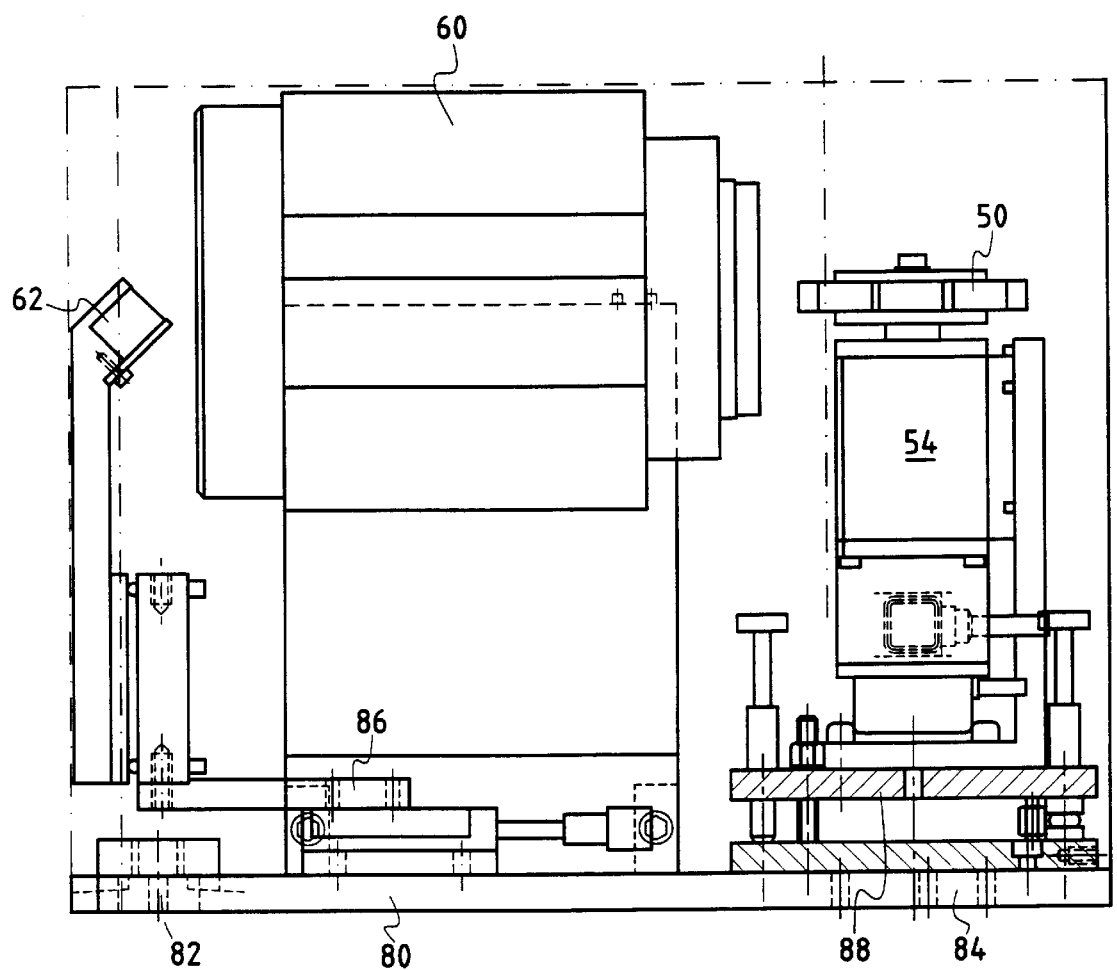
FIG. 6 is a side view of the same optical unit.

FIGS. 5 and 6 show a physical embodiment of an optical unit 22. In the embodiment shown in FIGS. 4 to 6, the acousto-optical modulator is not mounted on the baseplate of the optical unit. The six modulators are mounted on a separate plate which also has the beam splitter fixed thereto. This solution makes it possible to ensure that the acousto-optical modulators are accurately positioned relative to the divisional laser beams. The optical unit 22 comprises a baseplate 80 which is fixed to the top portion 14 of the structure of the machine via mechanical adjustment members such as 82 and 84. These members serve to compensate for assembly tolerances and to impart the angle a which the optical axis X'X' of the optical unit is to make with the X direction of the structure. These adjustment means also make it possible to correct an error in the travel direction X of the support relative to the direction Y of the panel. Under such circumstances, the angle imparted between the direction orthogonal to the Y direction of the panel and the optical axis X'X' is equal to b so as to take both corrections into account. The deflector mirror 62 is mounted on the baseplate 80 via a plate 86 which enables the position of the mirror 62 to be adjusted with great precision relative to the baseplate. Similarly, the rotary polygonal mirror 50 and its motor 54 are fixed on a plate 88 that is adjustable relative to the baseplate 80.

These figures also show the objective lens system 60 and the mirror 48 used for deflecting the laser beam to the rotary mirror 50.

What is claimed is:

1. A machine for exposing a panel to laser radiation, said panel having a working length L in a first direction Y, said length L being divided into N successive segments of length L/N, said machine comprising:

a fixed structure;

a horizontal panel support for receiving said panel;

displacement means for moving said support relative to said structure in a direction X that is orthogonal to the Y direction of the panel;

means for generating N main laser beams;

modulator means for modulating each main laser beam in time; and

N optical units that are fixed relative to said structure each having an optical axis in a direction that is substantially orthogonal to the Y direction, each optical unit comprising:

deflector means for periodically converting one of the main beams into a beam that is continuously deflected and that is modulated in time, said beam being directed along the optical axis of said optical unit; and a deflector mirror for directing said deflected laser beam in a direction orthogonal to the X,Y plane towards said panel support, the length $l_1$ of said deflector mirror in the direction orthogonal to the optical axis of said unit and suitable for being struck by said beam during each period being greater than L/N;

said optical units being organized as two sets of optical units with each set having N/2 units if N is even and ½(N+1) and ½(N−1) units if N is odd, the units within each set being juxtaposed in the Y direction in such a manner that their deflector mirrors are substantially in alignment along the Y direction, the distance in the X direction between the deflector mirrors of the two sets being equal to D, the distance in the Y direction between the optical axes of two juxtaposed optical units in the same set being equal to 2L/N and the distance in the Y direction between the optical axis of a unit in one set and the optical axis of the nearest optical unit in the other set being equal to L/N, whereby the deflected laser beam from an optical unit is capable of scanning over a length $l_1$ that is longer than the length of the panel segment that needs to be scanned, the deflected laser beam thus being capable of being controlled to scan the panel segment from its first end to its second end.

2. A machine according to claim 1, wherein the deflector means of each optical unit comprise:

a rotary polygonal mirror having n facets for continuously deflecting said laser beam in the same plane during successive fixed periods corresponding to said facets; and objective lens means to focus and direct the beam as deflected successively by each facet of the polygonal mirror along the direction of said optical axis and in a common plane containing the Y direction.

3. A machine according to claim 2, wherein the modulator means comprise an acousto-optical modulator receiving said main beam and delivering said time modulated beam at its outlet.

4. A machine according to claim 3, wherein said acousto-optical modulator comprises control means for ensuring that during each scan period the first point of impact of the vertical laser beam on the panel coincides with the origin of the segment corresponding to the optical unit in question.

5. A machine according to claim 1, wherein:

said displacement means for moving the panel support in the X direction move said support continuously at a constant speed; and said direction of the optical axis of each optical unit is at an angle a with a direction orthogonal to the Y direction so as to compensate for the effect of the continuous displacement of the support in the X direction.

6. A machine according to claim 1, wherein:

said displacement means for moving the panel support in the X direction move said support continuously at a constant speed; and said direction of the optical axis of each optical unit is at an angle b with a direction orthogonal to the Y direction in order to compensate for the effect of the continuous displacement of said support in the X direction and to compensate for the error in perpendicularity between the travel direction X and the Y direction.

* * * * *